United States Patent
Kuriyama et al.

(10) Patent No.: US 6,848,171 B2
(45) Date of Patent: Feb. 1, 2005

(54) METHOD OF FABRICATING TEMPERATURE CONTROL DEVICE

(75) Inventors: Kazuya Kuriyama, Osaka (JP); Yoichi Yasue, Osaka (JP)

(73) Assignee: Komatsu Ltd., Tokyo (JP)

( * ) Notice: Subject to any disclaimer, the term of this patent is extended or adjusted under 35 U.S.C. 154(b) by 88 days.

(21) Appl. No.: 09/817,366

(22) Filed: Mar. 22, 2001

(65) Prior Publication Data

US 2002/0026708 A1 Mar. 7, 2002

(51) Int. Cl.$^7$ ................................................. H05B 3/00
(52) U.S. Cl. ........................... 29/611; 29/830; 29/840
(58) Field of Search ........................... 29/611, 840, 831, 29/830; 361/736, 694

(56) References Cited

U.S. PATENT DOCUMENTS 5,003,430 A * 3/1991 VonArx et al. ............. 361/736
6,128,188 A * 10/2000 Hanners ..................... 361/694

* cited by examiner

*Primary Examiner*—Timothy V. Eley
(74) *Attorney, Agent, or Firm*—Armstrong, Kratz, Quintos, Hanson & Brooks, LLP.

(57) ABSTRACT

A temperature control device with heat conduction properties such as heat homogeneity, responsiveness or the like is fabricated by improving flatness. In a method of fabricating a temperature control device (1) equipped with a temperature control element (2) configured by soft soldering a thermionic element (9) between the opposed electrodes (7) and (8) and a pair of heat conduction plates (3) and (4) disposed respectively on outside surfaces of respective insulating substrates (5) and (6) of the relevant temperature control device as well as electrodes (7) and (8) are formed respectively on opposing surfaces of a pair of insulating substrates (5) and (6) disposed in opposed positions, the heat conduction plate 4 is disposed on the outside surface of the insulating substrate 6 after soft soldering of the thermionic element 9 is performed, the insulating substrate 6 has the flexibility, in the soft soldering of the thermionic element 9, the soft solder 12a mixed with copper powder which is a layer thickness control member is used, and the soft soldering is carried out while adding the predetermined pressure.

7 Claims, 19 Drawing Sheets

(HIGH PRESSURE DURING SOFT SOLDERING, WITHOUT COPPER POWER)

(HIGH PRESSURE DURING SOFT SOLDERING, WITH COPPER POWER)

(LOW PRESSURE DURING SOFT SOLDERING, WITHOUT COPPER POWER)

(LOW PRESSURE DURING SOFT SOLDERING, WITH COPPER POWER)

IDEAL

UNDER PRESENT CIRCUMSTANCES

PRESENT INVENTION

PRESENT INVENTION

UNDER PRESENT CIRCUMSTANCES

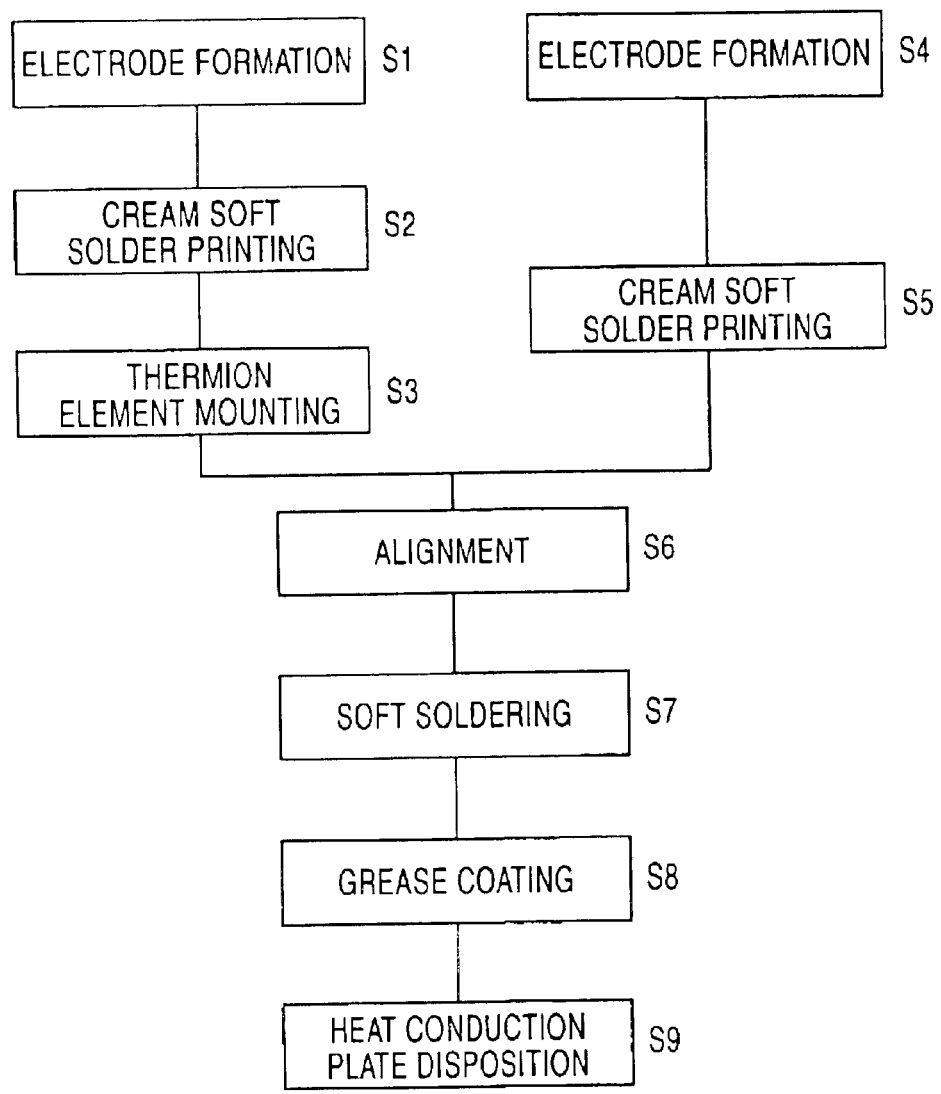

METHOD OF FABRICATING TEMPERATURE CONTROL DEVICE

BACKGROUND OF THE INVENTION

1. Field of the Invention

The present invention relates to a method of fabricating a temperature control device used for controlling a temperature, for example, of a silicon substrate in the fabrication processes.

2. Description of the Related Art

The processes of fabricating a semiconductor wafer include processes of controlling a temperature of a substrate such as, for example, a baking treatment process of heating the above described substrate in order to remove a remaining solvent in a photoresist film (photosensitive film), which is the surface of a substrate coated, and a cooling treatment process for cooling a heated substrate to the level of room temperature. Therefore, a substrate treatment device used in these treatment processes is equipped with a temperature control device.

FIG. 18 is a side elevation view of a schematic configuration of a temperature control device. A temperature control device 40 is equipped with a temperature control element 41 and a pair of heat conduction plates 42 and 43 disposed on both sides of this temperature control element 41. The temperature control element 41 has a pair of insulating substrates 44 and 45 disposed in opposed positions, electrodes 46 and 47 are formed on the opposing surfaces of these insulating substrates 44 and 45, respectively. A P-type element and a N-type element are connected between the opposing electrodes 46 and 47 by soft soldering as a thermionic element 48. The thermionic element 48 is connected via the electrodes 46 and 47 so that the P-type element and the N-type element are disposed in series in an alternate manner. Therefore, in the temperature control element 41, when the current is flown to the row of the thermionic elements from one direction, one of the insulating substrates, i.e., the insulating substrate 44 is of an endothermic side, and the other insulating substrate, i.e., the insulating substrate 45 is of a radiator side, and when the current flows in the other direction, one of the insulating substrate, i.e., the insulating substrate 44 is a of radiator side, the other insulating substrate, i.e., the insulating substrate 45 is of an endothermic side. It should be noted that a pair of heat conduction plates 42 and 43 are disposed on the outside surfaces of the respective insulating substrates 44 and 45 in order to enhance the responsiveness and the heat homogeneity of the temperature control element 41.

FIG. 19 is a processing diagram for illustrating a conventional fabrication of a temperature control device. First, in the process S1, the electrode 46 is formed on the surface of one of the two insulating substrates, i.e., the insulating substrate 44. The electrode 46 is formed by etching for example, a copper plate pasted on the surface of the insulating substrate 44. Next, in the process S2, cream soft solder is printed on the predetermined position of the surface of the formed electrode. Then, in the process S3, one terminal of the thermionic element 48 is mounted in the location where the cream soft solder is printed.

On the other hand, in the process of S4, the electrode 47 is formed on the surface of the other insulating substrate 45. The electrode 47 is formed by etching a copper pasted on the surface of the insulating substrate 45 similarly to the above described process S1. Then, in the process S5, a cream soft solder is printed on the predetermined location of the formed electrode surface.

Subsequently, in the process S6, a pair of insulating substrates 44 and 45 are aligned in order to perform soft soldering of the thermionic element 48 and the electrodes 46 and 47. The alignment is carried out so that the other terminal of the thermionic element 48 is contacted with the cream soft solder of the surface of the electrode of the other insulating substrate 45 as well as the insulating substrates 44 and 45 are disposed so that the electrodes 46 and 47 are opposed each other. Then, in the process S7, these are heated to a temperature more than the temperature of the fusing point of the soft solder, for example, on the order of 200° C. and the soft soldering of the thermionic element 48 and the electrodes 46 and 47 are carried out.

Subsequently, in the process of S8, grease is coated on the outer sides of a pair of insulating substrates 44 and 45, respectively. Coating the grease promotes the enhancement of the heat conductivity property such as the responsiveness of the temperature control and the heat homogeneity of the surface of the heat conduction plate by enhancing the adhesion and the heat conductivity between the insulating substrates 44 and 45 and the heat conduction plates 42 and 43. Then, in the process S9, the heat conduction plates 42 and 43 are disposed on the outer sides of a pair of insulating substrates 44 and 45 while making the grease layers stand therebetween, thereby completing the temperature control device 40.

In the process S7 of soft soldering of the above described thermionic element 48, a slight load is added to the direction of a pair of insulating substrates 44 and 45 getting closer to each other in order to prevent the defect of soft soldering and the deviation of location. However, if the load is too slight, since the thickness of soft solder layers generates the variations, the flatness which is important to enhance the heat conduction property cannot be secured. Particularly, in the case where the thickness of the insulating substrates 44 and 45 are made thinner, since the insulating substrates 44 and 45 are easily deformed, and the lowering of the flatness is significant.

On the other hand, if the load is made heavier in order to homogenize the thickness of soft soldering, the melting soft soldering is flown out to the circumference of the site of soft soldering, the thickness of soft solder layer cannot be secured, and the strength of the soft soldering is lowered. Hence, the technology that the thickness of the soft solder layer is secured by employing the soft solder mixed with copper powder, and the strength of the soft soldering is secured has been proposed (see Japanese Unexamined Patent Publication No. Hei 6-290819 gazette; Japanese Unexamined Patent Publication No. Hei 1-17839 gazette). However, in the case where soft solder mixed with copper powder is used, the problem that the flatness can not be maintained occurs.

Moreover, when the heat conduction plates 42 and 43 are disposed, it is necessary to rub the heat conduction plates 42 and 43 and the insulating substrates 44 and 45 together following coating a grease on the insulating substrates 44 and 45. However, it is difficult to add the heavy load in a uniform manner if the coating area of the grease is large. Therefore, the problem that the variations of the thickness of grease layers is generated and the flatness which is crucial for enhancing the heat conduction property cannot be secured. Moreover, since bubbles incorporated within the grease at the time when the grease is coated remains as those are, the problem that the variations of heat conduction rate is generated occurs. Still further, the problem that the tendency of the thickness of a grease layer is thickened by the remaining bubbles and the heat conduction rate is lowered also exists.

Furthermore, if the processing precision is enhanced and the flatness of them has been finely fabricated previously at the time of the fabrication of the insulating substrates 44 and 45 and the heat conduction plates 42 and 43, they can be nestled within the allowance range even if the flatness is degraded by the variations of the thickness of soft solder layers and grease layers. However, if the processing precision of machinery is enhanced, the problem that the cost of processing increases largely and the cost of fabrication is higher will occur.

SUMMARY OF THE INVENTION

The present invention has been carried out in order to solve the above described conventional defects, and an object of the present invention is to provide a method of fabricating a temperature control device at low cost which is capable of fabricating a temperature control device whose heat conduction properties such as the heat homogeneity and the responsiveness are enhanced by improving the flatness.

Then, a method of fabricating a temperature control device according to claim 1 is characterized in that in a method of fabricating the temperature control device 1 equipped with the temperature control element 2 configured by performing the soft soldering of the thermionic element 9 between the opposing electrodes 7 and 8 and a pair of heat conduction plates 3 and 4 disposed respectively on the outside surfaces of the respective insulating substrates 5 and 6 of the temperature control element 2 as well as the electrodes 7 and 8 are formed on the opposed surfaces of a pair of insulating substrates 5 and 6 disposed in opposed positions, respectively, at least one 4 of a pair of heat conduction plates 3 and 4 described above, is disposed on the outside surface of the insulating substrate 6 following performing the soft soldering of the above described thermionic element 9, the insulating substrate 6 on which the heat conduction plate 4 is disposed has a flexibility, a soft solder 12 mixing layer thickness control members is used for the soft soldering of the above described thermionic element 9 and the soft soldering is carried out while adding a predetermined pressure.

In a method of fabricating a temperature control device according to the above described claim 1, since the soft soldering is carried out while adding a predetermined pressure, the flatness of the soft solder 12a can be realized. Therefore, the flatness of the insulating substrate 6 is enhanced, therewith the flatness of the heat conduction plate 4 disposed at the outside side of the insulating substrate 6. Owing to this, the temperature control device 1 whose heat conduction properties such as the responsiveness, the heat homogeneity and the like are enhanced can be fabricated. Moreover, it can be carried out at lower cost comparing to that of the case where the flatness is enhanced by the machinery processing. It should be noted that since a layer thickness control member is mixed in the soft solder 12, the soft solder layer thickness on the order of the outside diameter of layer thickness control member at the minimum can be secured, and the predetermined strength of soft soldering can be secured.

Moreover, a method of fabricating a temperature control device according to claim 2 is characterized in that in a method of fabricating the temperature control device 1 equipped with the temperature control element 2 configured by performing the soft soldering of the thermionic element 9 between the opposing electrodes 7 and 8 and a pair of heat conduction plates 3 and 4 disposed respectively on the outside surfaces of the respective insulating substrates 5 and 6 of the temperature control element 2 as well as the electrodes 7 and 8 are formed on the opposed surfaces of a pair of insulating substrates 5 and 6 disposed in opposed positions, respectively, at least one 4 of a pair of heat conduction plates 3 and 4 described above, is disposed on the outside surface of the insulating substrate 6 following performing the soft soldering of the above described thermionic element 9, the insulating substrate 6 on which the heat conduction plate 4 is disposed has a flexibility, after the soft soldering of the above described thermionic element 9 is carried out, the above described soft solder layer 12a is flattened by adding the pressure multiplied by 0.8–1.5 of the yield stress at the temperature as well as heating the soft solder layer 12a at a temperature which is less than the fusing point and more than the apparent initial softening point of the soft solder.

In the method of fabricating a temperature control device according to the above described claim 2, since the soft solder layer 12a is pressurized in a softened state following the soft soldering, the soft solder is deformed and the flatness of the soft solder layer 12a can be realized. Therefore, the flatness of the insulating substrate 6 is enhanced, therewith enhancing the flatness of the heat conduction plate 4 disposed on the outer side of the insulating substrate 6. Owing to this, the temperature control device 1 whose heat conduction properties such as the responsiveness, the heat homogeneity and the like are enhanced can be fabricated. Moreover, it can be carried out at lower cost comparing to the case where the flatness is enhanced by the machinery processing. It should be noted that since the pressure is added at a temperature which is less than the fusing point of the soft solder 12, the soft solder 12 is not flown, the predetermined thickness of the soft solder layer is secured and the predetermined strength of the soft soldering can be secured.

Furthermore, a method of fabricating a temperature control device according to claim 3 is characterized in that the above described soft solder layer 12a contains a layer thickness control member.

In a method of fabricating a temperature control device according to the above described 3, since a layer thickness control member is mixed in the soft solder 12, the thickness of the soft solder layer on the order of the outside diameter of a layer thickness control member is secured at the minimum at the time when the soft solder layer 12a is flattened. Therefore, control of the soft solder thickness (homogeneity) can be easily and securely carried out.

A method of fabricating a temperature control device according to claim 4 is characterized in that in a method of fabricating the temperature control device 1 equipped with the temperature control element 2 configured by performing the soft soldering of the thermionic element 9 between the opposing electrodes 7 and 8 and a pair of heat conduction plates 3 and 4 disposed respectively on the outside surfaces of the respective insulating substrates 5 and 6 of the temperature control element 2 as well as the electrodes 7 and 8 are formed on the opposed surfaces of a pair of insulating substrates 5 and 6 disposed in opposed positions, respectively, at least one plate 4 of a pair of heat conduction plates 3 and 4 described above, is disposed on the outside surface of the insulating substrate 6 by making the grease layer 10 stood between the heat conduction plate 4 and the insulating substrate 6, the insulating substrate 6 on which the heat conduction plate 4 is disposed by making the grease layer 10 stood between the pressurized plate 25 and the insulating substrate 6 has a flexibility, after the heat conduction plate 4 is disposed by making the grease layer 10 stood between the heat conduction plate 4 and the insulating substrate 6, the above described grease layer 10 is flattened by pressurizing at about 0.6–10 kg/cm$^2$ as well as heating in the range of about 120–170° C.

In a method of fabricating a temperature control device according to the above described claim 4, since the grease layer 10 is heated and pressurized, the flatness and thinness of the grease layer 10 can be realized. Moreover, since the bubbles incorporated within the grease layer 10 are pushed out to the external, thereby being capable of contributing to the thinness of layer as well as the homogeneity of heat conduction rate is realized. Therefore, the flatness of the heat conduction plate 4 is enhanced by the flatness of the grease layer 10, and the heat conduction rate is enhanced by the thinness of the grease layer 10 and the reduction of the bubbles, thereby being capable of fabricating the temperature control device 1 whose heat conduction properties such as the responsiveness, the heat homogeneity and the like are enhanced. Moreover, the fabrication of it can be carried out at lower cost comparing to that of the case where the flatness is enhanced by the machinery processing.

A method of fabricating a temperature control device according to claim 5 is characterized in that after performing the soft soldering of the above described thermionic element 9, the above described soft solder layer 12a is flattened by adding the pressure multiplied by 0.8–1.5 of the yield stress at the temperature as well as the soft solder layer 12a is heated to a temperature which is the fusing point of the soft solder or less and the apparent initial softening point of the soft solder or more, and the flatness of the above described grease layer 10 and the flatness of the above described soft solder layer 12a are simultaneously carried out.

In a method of fabricating a temperature control device according to the above described claim 5, since the flatness of the grease layer 10 and the flatness of the soft solder layer 12a are simultaneously carried out, one of the processes can be omitted and the fabrication time can be shortened.

In a method of fabricating a temperature according to claim 6 is characterized in that the grease layer 10 is disposed by making the grease layer 10 stood between the heat conduction plate 4 and the insulating substrate 6 prior to the soft soldering of the above thermionic element 9.

In a method of fabricating a temperature control device according to the above described 6, since the heat conduction plate 4 is disposed on the insulating substrate 6 prior to the soft soldering, if it is set in a predetermined heating and pressurizing device, the soft soldering process, the flattening process of the soft solder layer 12a and the flattening of the grease layer 10 can be sequentially performed, the shortening of the fabrication time and the simplification of the fabrication processes can be realized. A method of fabricating a temperature control device according to claim 7 is characterized in that the heat conduction plate 4 is disposed by making the grease layer 10 stood between the insulating substrate 6 by following the soft soldering of the above described thermionic element 9, the soft soldering can be carried out quite well.

In a method of fabricating a temperature control device according to the above described claim 7, since the heat conduction plate 4 is disposed by making the grease layer 10 stood between after the soft soldering is performed, the deviation of location between the thermionic element 9 and the soft solder 12 is not generated, and the soft soldering can be carried out quite well.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention, wherein:

FIG. 19 is a flow diagram for illustrating a conventional method of fabricating a temperature control device.

DESCRIPTION OF THE PREFERRED EMBODIMENTS

Figure 1A:
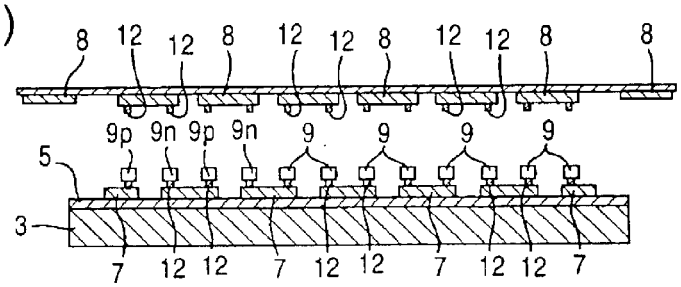
FIG. 1 is a sectional view for illustrating a method of fabricating a temperature control device which is one embodiment of the present invention.

Next, specific embodiments of a method of fabricating a temperature control device of the present invention will be described in detail with reference to the drawings. FIG. 1 is a sectional view for illustrating a method of fabricating the temperature control device 1 which is one embodiment of the present invention.

The temperature device 1 is, as shown in FIG. (d), equipped with the temperature control element 2 and a pair of heat conduction plates 3 and 4 disposed on both sides of the temperature control element 2. The temperature control element 2 has a pair of insulating substrates 5 and 6 disposed in opposed positions, on the opposing surfaces of the insulating substrates 5 and 6, a plurality of electrodes 7 and 8 are formed, respectively. A P-type element 9p and a N-type element 9n are connected by soft soldering as the thermionic element 9 between the electrodes 7 and 8 opposed each other. The thermionic element 9 is connected so that P-type element 9p and N-type element 9n are disposed via the electrodes 7 and 8 in series in an alternate manner. Therefore, the temperature control element 2, when the current flows to the row of the thermionic elements from one direction, one of the insulating substrates, i.e., the insulating substrate 5 is of an endothermic side, and the other insulating substrate, i.e., the insulating substrate 6 is of a radiator side; and when the current flows in the other direction, one of the insulating substrate, i.e., the insulating substrate 5 is of a radiator side, the other insulating substrate, i.e., the insulating substrate 6 is of an endothermic side. A pair of heat conduction plates 3 and 4 are disposed on the outside surfaces of the respective insulating substrates 5 and 6 in order to enhance the responsibility and the heat homogeneity of the temperature control element 2.

In the present embodiment, a method of fabrication when the temperature control device 1 used for cooling a semiconductor substrate is fabricated. Moreover, the temperature control device 1 makes one of the insulating substrates, i.e., the insulating substrate 5 functions as of an endothermic side, the other of the insulating substrates, i.e., the insulating substrate 6 functions as a radiator; then, supposing that a semiconductor substrate is mounted on the surface of one of the heat conduction plate 3 and cools it, and the other heat conduction plate 4 is cooled by water. Therefore, in the description described below, the terms are defined such that the heat conduction plate 3 on which a semiconductor substrate is mounted is referred to as a homogeneously heating plate, the heat conduction plate 4 is referred to as a water cooling plate. Further, in the temperature control device 1, it is defined that the homogeneously heating plate 3 has been previously adhered prior to the processes of fabricating the temperature control element 2 in order to secure the adhesion with the insulating substrate 5 and enhance the heat conduction rate. However, the water cooling plate 4 is disposed on the outside surface of the outside surface of the insulating substrate 6 after fabricating the temperature control device 2 by making the grease layer 10 stand therebetween.

First, as shown in FIG. 1(a), prior to the process of soft soldering, the insulating substrate 5 of the endothermic side and the insulating substrate 6 of the radiator side which have been pre-treated in a predetermined manner are prepared. In reference to FIG. 2 and FIG. 3, the predetermined pretreatment provided to the insulating substrates 5 and 6 will be described below.

Figure 2A:
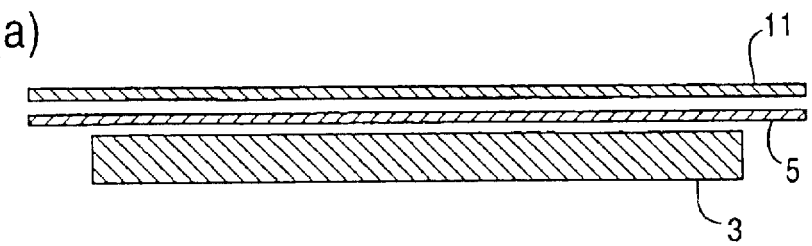
FIG. 2 is a sectional view for illustrating one portion of a method of fabrication.
Figure 2B:
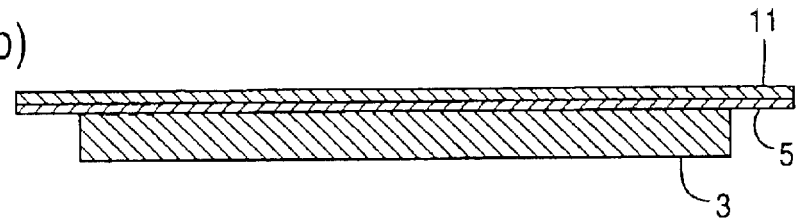
Figure 2C:
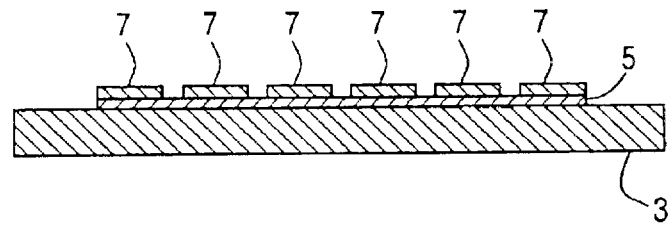
Figure 2D:
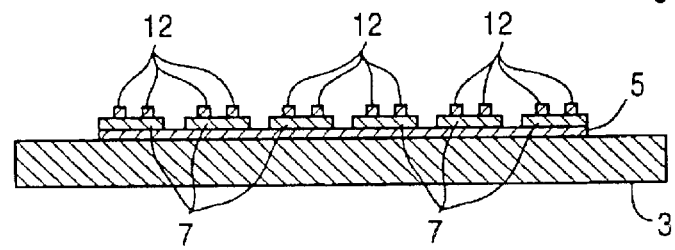

The isolating substrate 5 of the endothermic side is, for example, a polyimide film, as shown in FIG. 2(a), on one of the surfaces, a metal plate 11 is disposed, and the homogeneously heating plate 3 is disposed on the other surface of the insulating substrate 5. Then, the metal plate 11 and the homogenously heating plate 3 are pasted on the insulating substrate 5 of the endothermic side by the autoclave treatment (heating and pressurizing treatment), respectively (see FIG. 2(b)). The metal plate 11 is to be the electrode 7, for example, a copper plate is employed. Moreover, the homogenously heating plate 3 is consisted of a material having a high heat conduction rate, for example, metal complex plate consisted of aluminum (Al) and silicon carbide (SiC) is employed. Next, as shown in FIG. 2(c), a plurality of electrodes 7 by providing etching on the metal plate 11 are formed. Subsequently, as shown in FIG. 2(d), the cream soft solder 12 is disposed on the predetermined position of the surface of the electrode 7 is disposed by printing. It should be noted that the cream soft solder 12 contains a copper powder which is a layer thickness control member is mixed. Then, as shown in FIG. 1(a), one of the terminals of the thermionic element 9 is disposed on the cream soft solder 12, respectively, thereby terminating the pretreatment to the insulating substrate 5 of an endothermic side.

Figure 3A:
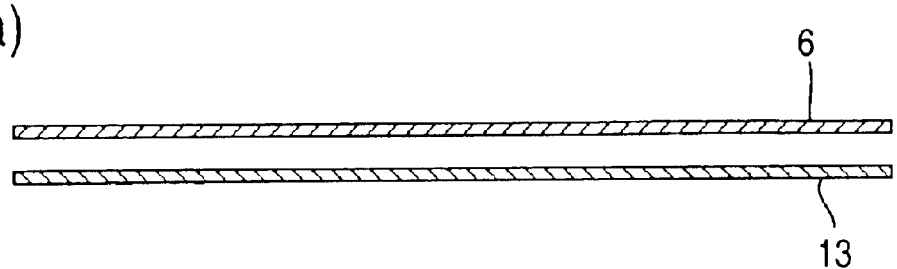
FIG. 3 is a sectional view for illustrating one portion of a method of fabrication.
Figure 3B:
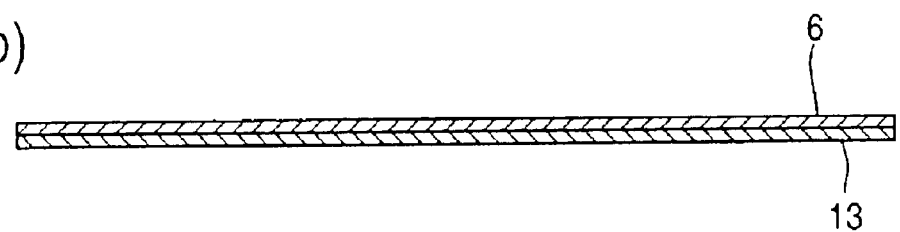
Figure 3C:
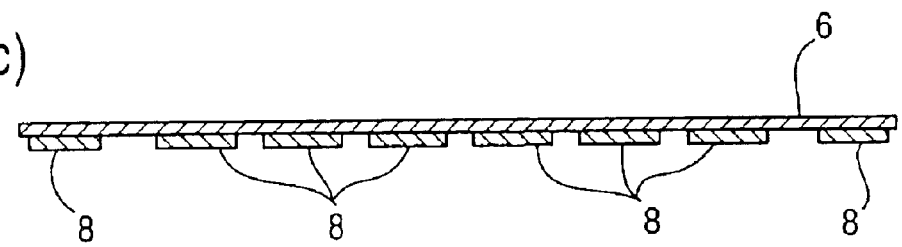

On the other hand, the insulating substrate 6 of the radiator side is also a polyimide film similar to the insulating substrate 5, and the metal plate 13 is disposed on one of the surfaces as shown in FIG. 3(a). Then, the metal plate 13 is pasted on the insulating substrate 6 of the radiator side by autoclave (FIG. 3(b)). The metal plate 13 is to be the electrode 8, a copper plate is employed similar to the metal plate 11. Next, as shown in FIG. 3(c), a plurality of electrodes 8 are formed by providing etching on the metal plate 13. Then, as shown in FIG. 1(a), the cream soft solder 12 is disposed on the predetermined location of the surface of the electrode 8 by printing, thereby terminating the pretreatment to the insulating substrate 6 of the radiator side.

Figure 1B:
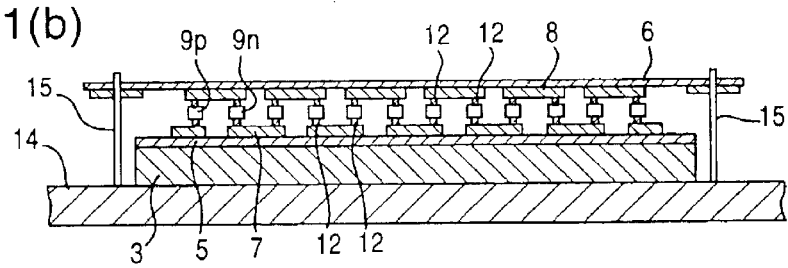

The insulating substrates 5 and 6 on which the pretreatment has been provided as described above, is set on the predetermined jig 14 as shown in FIG. 1(b). The jig 14 is used for performing the alignment of the insulating substrates 5 and 6. The insulating substrate 5 is set on the upper face of the jig 14 by making the homogenously heating plate 3 downward so that the electrode 7 on which the thermionic element 9 and the cream soft solder 12 are disposed is made upward. On the other hand, the isolating substrate 6 is maintained by pins 15 and 15 for positioning and set on the upper side of the insulating substrate 5 so that the electrode 8 on which the cream soft solder 12 is made downward. Specifically, the insulating substrates 5 and 6 are disposed such that the electrodes 7 and 8 are in opposed positions to each other, as well as such that the other terminal of the thermionic element 9 disposed on the insulating substrate 5 of the endothermic side and the cream soft solder 12 disposed on the insulating substrate 6 of the radiator side are contacted with each other. The pins 15 and 15 for positioning are provided on the upper face of the jig 14.

Figure 1C:
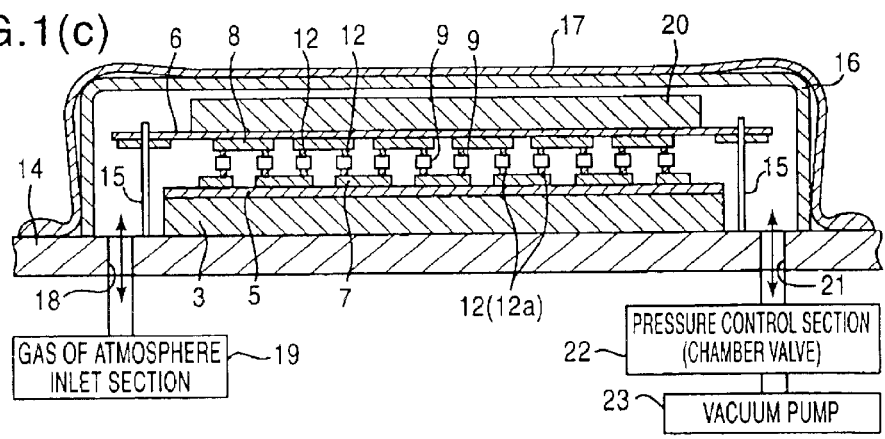

After performing the alignment as described above, the soft soldering of the thermionic element 9 and the electrodes 7 and 8 are carried out. The soft soldering is carried out in the predetermined gas of atmosphere, in a state of a predetermined pressure being added on the cream soft solder 12. As shown in FIG. 1(c), on the upper face of the jig 14, a cover 16 is disposed so as to cover the whole of the insulating substrates 5 and 6 following the alignment and further a backing sheet 17 is provided so as to cover the whole of the cover 16 as well. A closed space is formed by the jig 14 and the backing sheet 17, and the insulating substrates 5 and 6 following the alignment are to be disposed within this closed space. An inlet hole 18 communicating to the closing space on the jig 14 is formed, a gas is supplied from the gas of atmosphere inlet section 19 to the closed space via the inlet hole 18. In the present embodiment, CO gas is supplied, the pressure is set at about 100 mm Torr. Moreover, on the upper face of the insulating substrate 6 disposed upward, a weight 20 is placed. The weight 20 is formed in a plane shape and in a dimension which can cover the whole region where the thermionic element 9 is disposed. Accordingly, a predetermined pressure is added by the hydrostatic pressure due to the pressure difference with atmospheric pressure and the weight 20 on the cream soft solder 12 in the direction in which the thermionic element 9 and the electrodes 7 and 8 are closed in. In this way, the soft soldering is carried out by heating to a temperature more than the fusing point of the cream soft solder 12 in a state of the predetermined pressure being added in the CO gas atmosphere, thereby completing the processes of the temperature control element 2.

After performing the above described soft soldering, the flattening treatment of the soft solder layer 12a is carried out. The flattening treatment of the soft solder layer 12a is carried out by adding the predetermined on the soft solder layer 12a as well as heating the soft solder layer 12a under the decompression to a predetermined temperature. On the jig 14, the draft hole 21 communicating to the above described closed space is formed, a vacuum pump 23 is connected via the pressure control section 22 to the draft hole 21. The formation of the pressure control section 22 is realized, for example, with a chamber valve. Therefore, the inside of the closed space can be decompressed by drafting the air (gas) from the draft hole 21 by driving the vacuum pump 23. Then, the heating of the soft solder layer 12a is carried out similar to the case of the soft soldering. Moreover, the pressurizing on the soft solder layer 12a is carried out by utilizing the hydrostatic pressure due to the pressure difference compared to the atmospheric pressure and the above described weight 20.

Figure 1D:
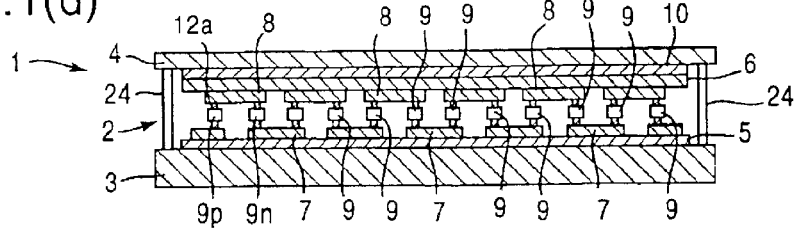

After the flattening treatment of the above described soft solder layer 12a is carried out, as shown in FIG. 1(d), the water cooling plate 4 is disposed via the grease layer 10 in the outer side of the insulating substrate 6 of the radiator side, while the flattening treatment of the grease layer 10 is carried out. The flattening treatment of the grease layer 10 is carried out by adding a predetermined pressure on the grease layer 10 as well as heating the grease layer 10 to a predetermined temperature. The heating of the grease layer 10 can be carried out similar to the case of the soft soldering. Moreover, the pressurizing on the grease layer 10 can be carried out by utilizing the above weight 20. Therefore, the flattening treatment of the grease layer 10 can be carried out sequentially by utilizing the above described jig 14 subsequent to the soft soldering and the flattening treatment of the soft solder layer 12a.

Finally, the water cooling plate 4 is fixed on the homogenously heating plate 3 by the bolts 24 and 25, the processes of the temperature control device 1 is completed.

Next, the features of the method of the present invention will be described below. The first feature of the present invention is that, upon soldering the thermionic element 9 and the electrodes 7 and 8, the cream soft solder 12 mixed with a large amount of copper powder is used and the soft soldering is carried out while a predetermined pressure is added. In this manner, since the soft soldering is carried out while the predetermined pressure is added, the flattening of the soft solder layer 12a can be realized. Therefore, the flatness of the insulating substrate 6 having the flexibility like a polyimide film is enhanced, thereby enhancing the flatness of the water cooling plate 4 disposed in the outer side of the insulating substrate 6. Moreover, since the homogenously heating plate 3 has been pasted on the insulating substrate 5 previously, it has sufficient flatness. Accordingly, the temperature control device 1 whose heat conduction properties such as the responsiveness, the heat homogeneity and the like are enhanced can be fabricated. Moreover, it can be carried out at lower cost comparing to that of the case where the flatness is enhanced by the machinery processing.

Figure 4:
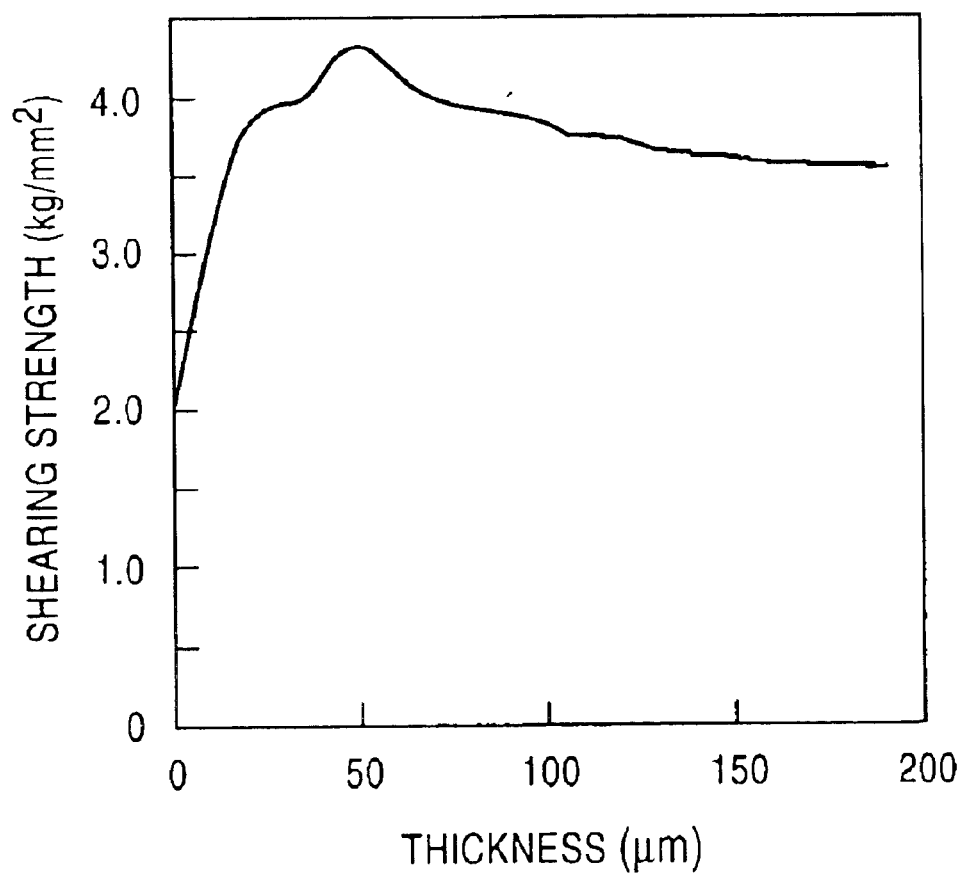
FIG. 4 is a graphical representation showing the relationship between shearing strength of a soft solder layer and a thickness of a soft solder layer.

It should be noted that since a large amount of copper powder is mixed in the cream soft solder 12, the soft solder layer thickness on the diameter of the copper powder is secured at minimum, and the predetermined strength of the soft soldering can be secured. As shown in the graph of FIG. 4, the shearing strength of the soft solder layer is gradually reduced as the soft solder layer is less than 50 $\mu$m, and reduced rapidly as the soft solder layer is less than 25 $\mu$m, therefore, it is preferable that the soft solder layer thickness is about 50 $\mu$m–200 $\mu$m.

The second feature of the present invention is that after performing the soft soldering of the thermionic element 9 and the electrodes 7 and 8, the flattening treatment of the soft solder layer 12a by heating the soft solder layer 12a to the predetermined temperature, adding the predetermined pressure and causing the soft solder deformed in a creep shape. The predetermined temperature is a temperature less than the fusing point of the cream soft solder 12 and more than the apparent initial softening point, for example, in the case of 63 Sn•37 Pb eutectic soft solder, since the fusing point is about 183° C., the apparent initial softening point is about 120° C., a temperature in the range of about 120° C.–170° C. is selected. Moreover, the predetermined pressure is a pressure multiplied by 0.8–1.5 of the yield stress at the temperature, for example, in the case where Pb—Sn soft solder is heated at 160° C., it is on the order of 1 kg/mm$^2$.

Figure 5:
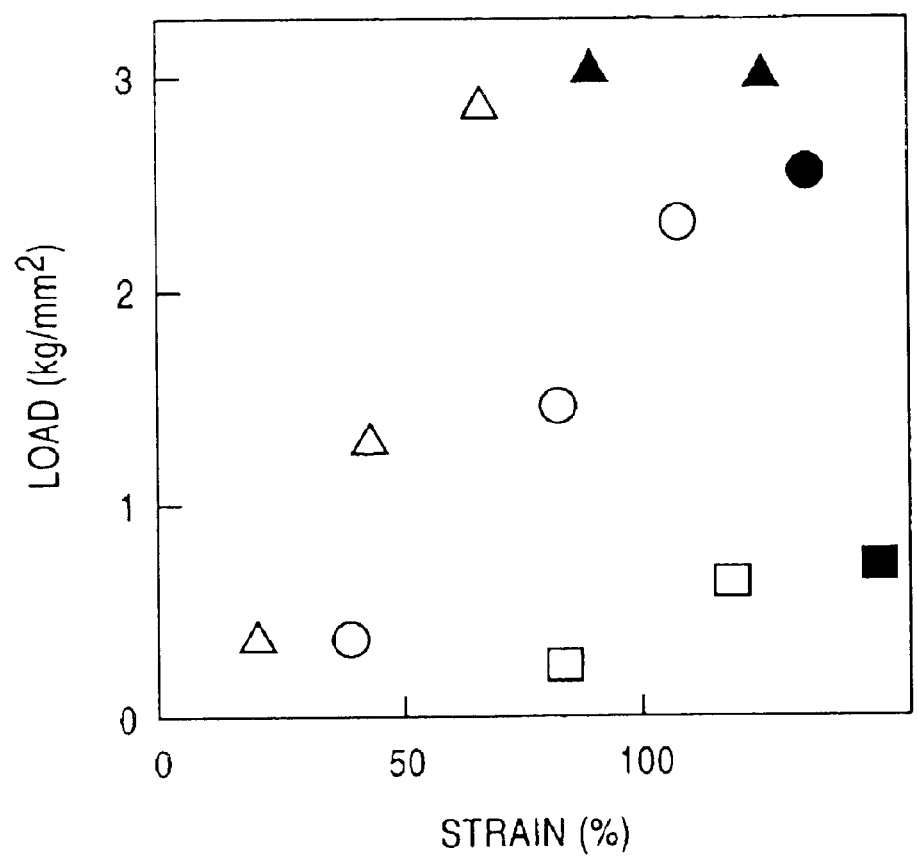
FIG. 5 is a graphical representation showing the relationship between a load adding on a soft solder layer and a generated strain.
Figure 6:
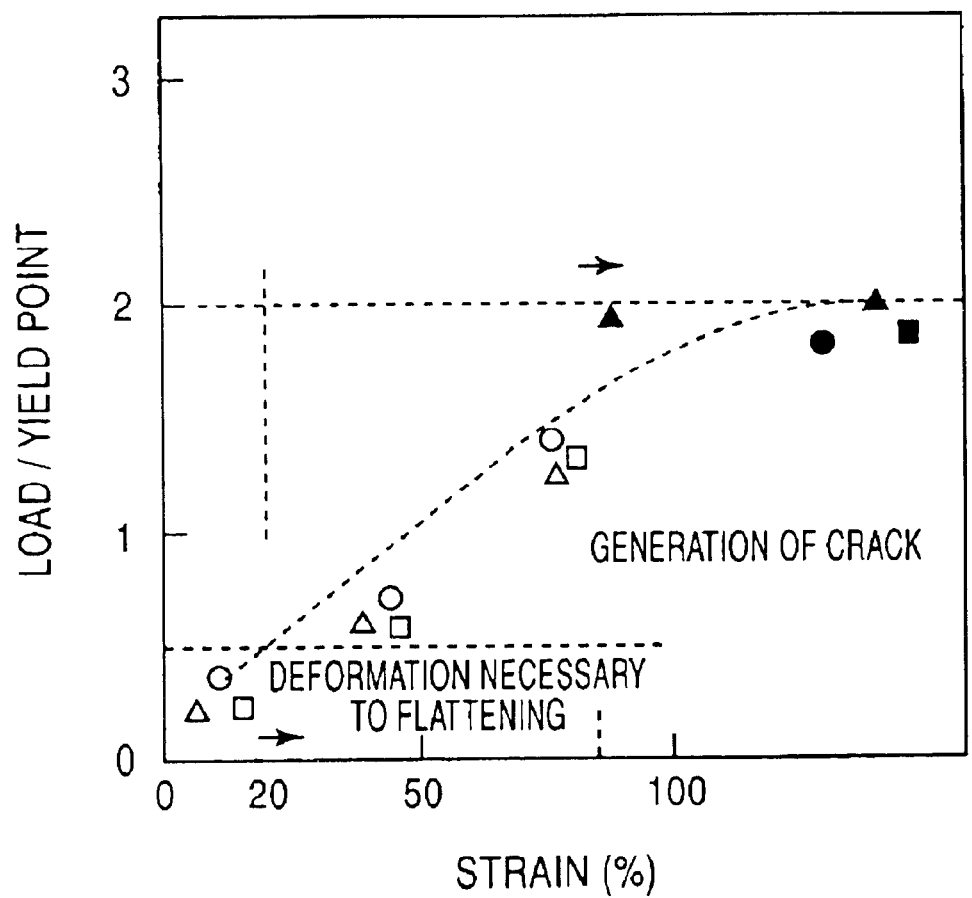
FIG. 6 is a graphical representation showing the relationship between a load/yield point and a generated strain.

FIG. 5 is a graphical representation showing the relationship between a load added on the soft solder and the generated strain. The heating temperature of the soft solder layer is 150° C., the circular mark denotes the measurement results of Sn—Pb—Si soft solder, the triangular mark denotes the measurement results of Sn—Pb eutectic soft solder, and the rectangular mark denotes the measurement result of indium based soft solder. Moreover, FIG. 6 is a graphical representation showing the relationship between the load/yield point and the strain, and FIG. 5 compiles the measurement results. It should be noted that the black mark shows that a crack is generated in FIG. 5 and FIG. 6.

Although the deformation necessary to the flattening is at least strain 20%, preferably strain 50%, if it exceeds over strain 80%, a crack is generated. Then, in FIG. 6, the load/yield point (yield stress) at strain 50% is 0.8, the load/yield point at strain 80% is 1.5. Therefore, it should be understood that it is beneficial for the pressure to be multiplied by 0.8–1.5 of the yield stress at the heating temperature of the soft solder layer at the time of flattening.

In this way, since the pressure is added on the soft solder layer in a state where the soft solder layer 12a is softened after the soft soldering, the flattening of the soft solder layer 12a can be realized. Therefore, the flatness of the insulating substrate 6 having the flexibility like a polyimide film is enhanced, thereby enhancing the flatness of the water cooling plate 4 disposed in the outer side of the insulating substrate 6. Moreover, since the homogeneously heating plate 3 has been previously pasted on the insulating substrate 5, it has sufficient flatness. Consequently, the temperature control device 1 having heat conduction properties such as responsiveness, the homogeneity or the like can be fabricated. Moreover, it can be carried out at lower cost comparing to that of the case where the flatness is enhanced by a machinery processing.

It should be noted that since the pressure is added at the temperature less than the fusing point of the soft solder 12, the soft solder 12 does not flow out, the predetermined soft solder layer thickness is secured, and the predetermined intensity of the soft soldering can be secured. Moreover, since copper powder is mixed in the soft solder 12, the thickness of the soft solder layer 12a on the order of the diameter of copper powder at minimum is secured. Therefore, control (homogeneity, uniformity) of the thickness of the soft solder layer can be easily and securely carried out.

Figure 7A:
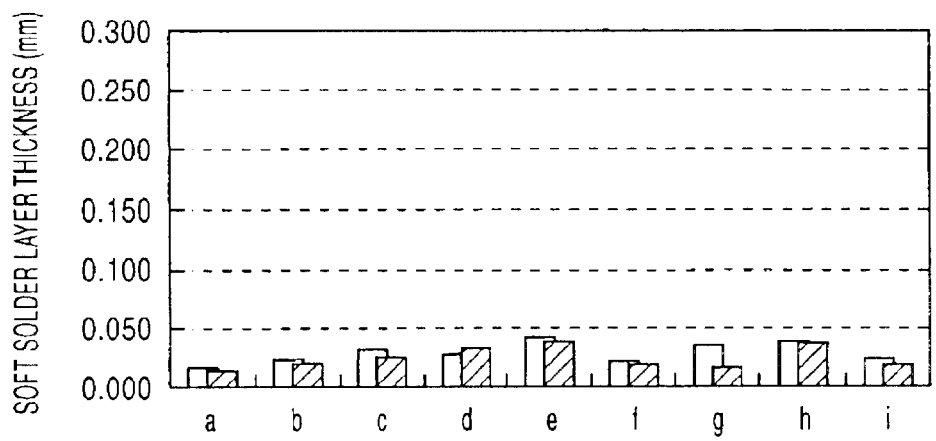
FIG. 7 is a graphical representation showing the measurement results of a soft solder layer thickness immediately after soft soldering and after the flatness.

FIG. 7 and FIG. 8 are graphical representations showing the measurement results between the thickness of the soft solder layer immediately after the soft soldering and the thickness of the soft solder layer after the flattening treatment is carried out. The flattening treatment was carried out by maintaining the state of heating to 159° C. at maximum for 5 minutes as well as adding the pressure of 4.5 kg/cm². However, the pressure was added after the heating temperature was 157° C. or more. It should be noted that "a" through "i" in the respective graphs are reference letters for distinguishing the measurement location, herein the measurement results of the soft solder layer thickness measured in 9 measurement locations are represented by bar graphs. The white bar graph of the left side represents the thickness of the soft solder layer immediately after the soft soldering, the hatched bar graph of the right side represents the thickness of the soft solder layer after the flattening.

FIG. 7 is a graphic representation in the case where the comparatively larger pressure is added at the time of the soft soldering: (a) represents the measurement results at the time when the soft solder which is not mixed with copper powder, and (b) represents the measurement results at the time when the soft solder which is mixed with copper powder having the diameter of about 100 μm. As it is understood from the graph of FIG. 7 (a), at the time when the soft solder which is not mixed with copper powder of a layer thickness control member, the thickness of the soft solder layers is all less than 0.050 mm (50 μm) at the stage immediately after the soft soldering, the thickness of the soft solder layer is further smaller by the flattening treatment. Therefore, in this case, a soft solder layer having a sufficient shearing strength cannot be formed.

Figure 7B:
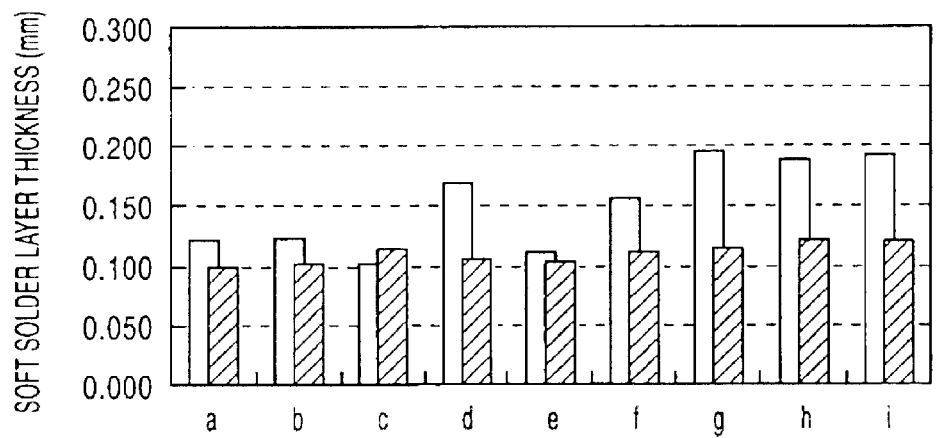

On the other hand, as understood from the graph of FIG. 7(b), at the time when the soft solder in which the copper powder having the diameter of about 100 μm is mixed, the thickness of the soft solder layers is more than 0.100 mm (100 μm) at the stage immediately after the soft soldering, although the soft solder layer having the sufficient shearing strength is formed, variations of the thickness of the soft solder layers are found. However, the thickness of the soft solder layer of 100 μm is approximately homogenized. Therefore, in this case, the flattened soft solder layer which has the sufficient shearing strength and whose layer thickness is uniformed can be formed.

Figure 8A:
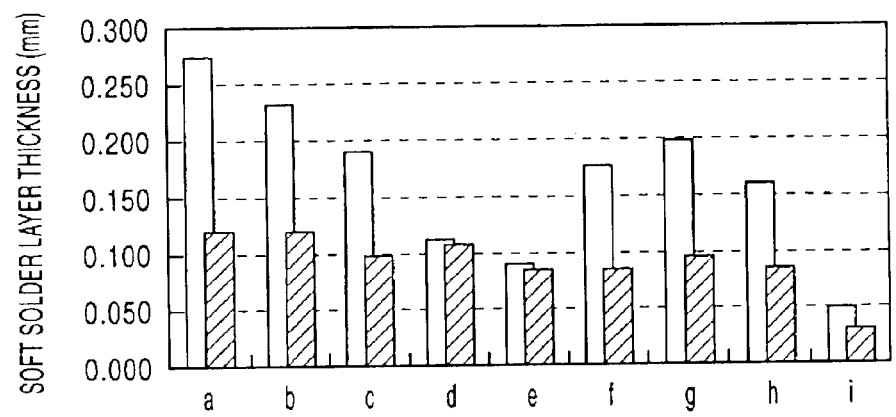
FIG. 8 is a graphical representation showing the measurement results of a soft solder layer thickness immediately after soft soldering and after the flatness.

Moreover, FIG. 8 is a graphical representation in the case where the comparative slight pressure is added at the time of the soft soldering: (a) represents the measurement results at the time when the soft solder mixed with copper powder was used, and (b) represents the measurement result at the time when the soft solder mixed with the copper powder having the diameter of about 100 μm. As understood from the graph of FIG. 8(a), although there are variations of the thickness of the soft solder layers at the stage immediately after the soft soldering was performed, the thickness being more than 0.050 mm (50 μm), the soft solder layer having a sufficient shearing strength is formed. Then, the thickness of soft solder layers of 100 μm is approximately uniformed. Therefore, also in this case, the flattened soft solder layer which has a sufficient shearing strength and the thickness of the layers is uniformed as well. However, since the copper powder is not mixed in the soft solder, there are some cases where the thinner portion of the thickness of the soft solder like the measurement location "i" is generated.

Figure 8B:
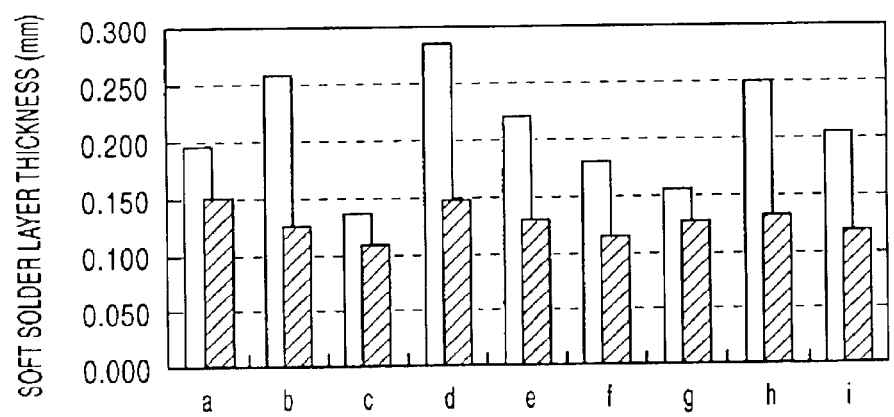

On the other hand, as it is understood from the graph of FIG. 8(b), although the variations of the thickness of the soft solder layers is found at the stage immediately after the soft soldering was performed similar to FIG. 8(a) by making the pressure be smaller at the time when the soft soldering is performed, all is more than 0.100 mm (100 μm), the soft solder layer having a sufficient shearing strength is formed. It should be noted that the thickness of the layer is more than 100 μm because the copper powder is mixed. Then, the thickness of the soft solder layers is uniformed in approximately 100 μm by performing the flattening treatment. Therefore, also in this case, the flattened soft solder layer which has a sufficient shearing strength and whose layer thickness is uniformed as well can be formed. However, since the added pressure is small at the time of soft soldering, the thickness of the soft solder layers immediately after the soft solder is performed is dispersed in a comparatively large range, and the variations of the thickness of the soft solder layers is also large comparing to the dispersion range of the case where the added pressure is large at the time of soft soldering shown in FIG. 7(b).

By comparing the above described respective graphs of FIGS. 7 and 8, the following matters occur. First, when comparing the white bar graphs between FIG. 7 and FIG. 8, it should be understood that the thickness of the soft solder layers on which the larger pressure is added at the time when the soft soldering is performed are much more uniformed. Moreover, in FIG. 7, when comparing the white bar graphs between (a) and (b), in the case where the comparatively large pressure is added at the time when the soft soldering is performed, it is understood that the soft solder layer having a sufficient shearing strength is formed. Therefore, it has been confirmed that it can be realized that the thickness of the soft solder layers is uniformed and the flatness is enhanced while maintaining a sufficient shearing strength by performing the soft soldering while adding a predetermined pressure using the soft solder mixed with the copper powder (the first feature of the present invention).

Moreover, in the respective graphs of FIG. 7 and FIG. 8, comparing the white bar graphs and the hatched bar graphs, it has been confirmed that the thickness of the soft solder layers is uniformed and the flatness is enhanced by heating the soft solder layer to the predetermined temperature and adding the predetermined pressure (flattening treatment of the soft solder layer (the second feature of the present invention). Furthermore, in comparing the hatched bar graphs between (a) and (b) respectively, in the case where the copper powder is mixed in the soft solder layer at the time when the flattening treatment of the soft solder layer is performed, the variations of the thickness of the soft solder layers is smaller and control of the thickness of the soft solder layer is easily carried out.

Moreover, in comparing the graphs of FIG. 7(b) and FIG. 8(b), it has been confirmed that the flatness is much more enhanced due to the uniformity of the thickness of the soft solder layers by performing the flattening treatment of the soft solder layer after performing the soft soldering while adding the predetermined pressure using the soft solder mixed with the copper powder.

Moreover, the third feature of the present invention is that after the grease layer 10 is disposed by making the grease layer 10 stood between the water cooling plate 4 and the insulating substrate 6, the flattening treatment of the grease layer 10 is carried out by heating the grease layer 10 to the predetermined temperature under the decompressed conditions and adding the predetermined pressure. The predetermined temperature is in the range of about 120° C.–170° C., and the predetermined pressure is in the range of about 0.6–10 kg/cm².

In this way, the grease layer 10 is heated and pressurized, the flattening and thinning of the grease layer 10 can be realized. Moreover, since the bubbles incorporated within the grease layer is enlarged by the decompression and heating and this enlarged bubbles are pushed out to the external, it is capable of contributing to the thinning of the layer as well as the uniformity of the heat conduction rate can be realized. Therefore, the flatness of the water cooling plate 4 is enhanced by the flattening of the grease layer 10, and the heat conduction rate is enhanced by the thinning of the grease layer 10 and the reduction of bubbles. Moreover, since the homogenously heating plate 3 has been previously mounted on the insulating substrate 5, it has a sufficient flatness. Consequently, the temperature control device 1 with heat conduction properties such as the responsiveness and the heat homogeneity can be fabricated. Moreover, in comparing to the case where the flatness is enhanced by the machinery processing, it can be carried out at lower cost.

Figure 9:
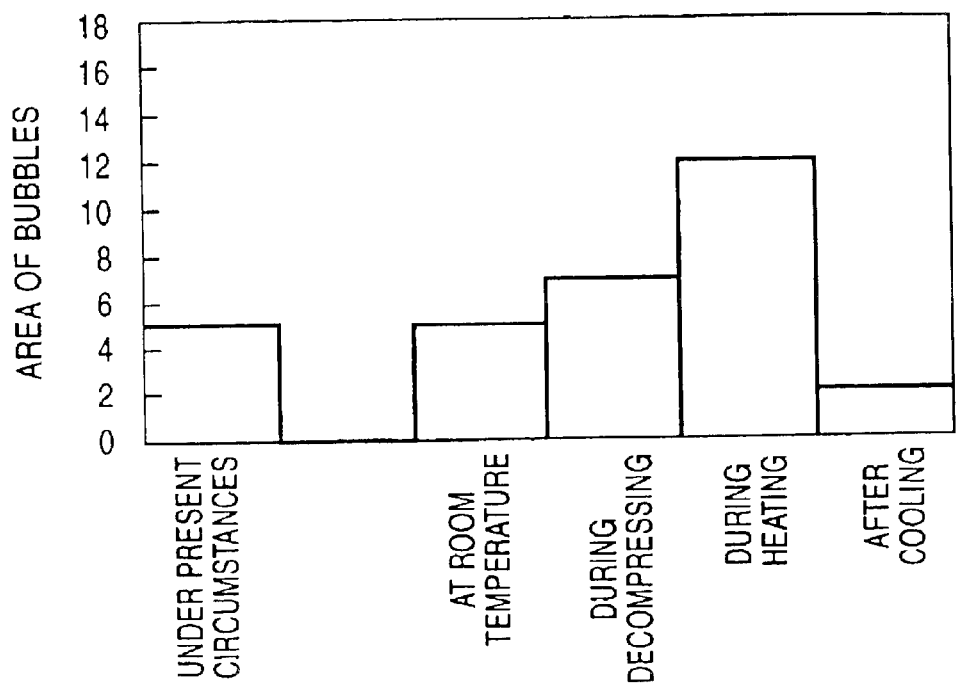
FIG. 9 is a graphical representation showing an area of bubbles in the grease layer.

FIG. 9 is a graphical representation showing an area of bubbles in the grease layer. The area of bubbles of the grease layer is about 5 which is an available value at present. On the other hand, in the present invention, it is similar to the case under room temperature and atmospheric pressure. However, since an area of bubbles is increased by enlarging the bubbles due to the decompression and heating, the enlarged bubbles are pushed out to the external by adding the load. Therefore, by cooling it to the room temperature and returning to the atmospheric pressure, the remaining bubbles are diminished, as a result, the area of bubbles are capable of being reduced to about on the order of 2 which is less than a half of the available value at present.

Figure 10A:
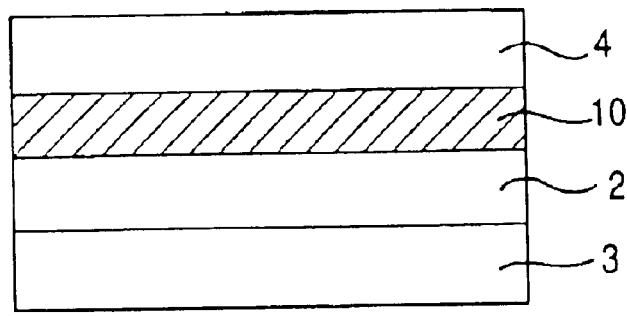
FIG. 10 is a schematic diagram showing the flatness of a temperature control device.
Figure 10B:
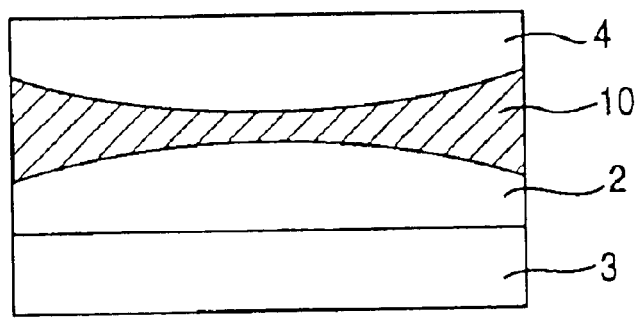
Figure 10C:
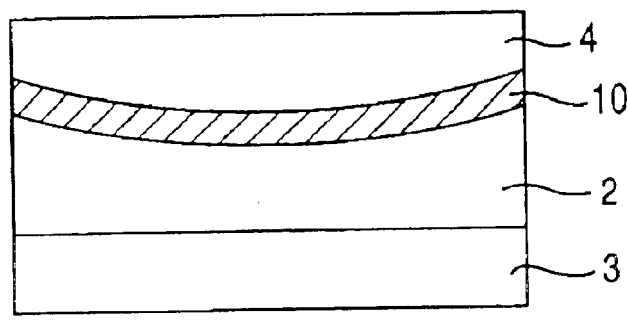

FIG. 10 is a schematic diagram showing the flatness of the temperature control device 1. As shown in FIG. 10(a), although it is ideal that all of the temperature control element 2, the grease layer 10, the water cooling plate 4 are flat, at present, as shown in FIG. 10(b), the variations of the thickness of the soft solder layers of the temperature control element 2 is found, and the variations of the thickness of the grease layer 10 are also found. On the other hand, in the present invention, as shown in FIG. 10(c), since the soft solder layer of the temperature control element 2 is flattened, the variations of the thickness is smaller, and the variations of the thickness of the grease layer 10 are also smaller, Therefore, the distance between the temperature control element 2 and the water cooling plate 4 is approximately uniformed, the heat conduction properties such as the responsiveness, the heat homogeneity and the like are enhanced.

Figure 11A:
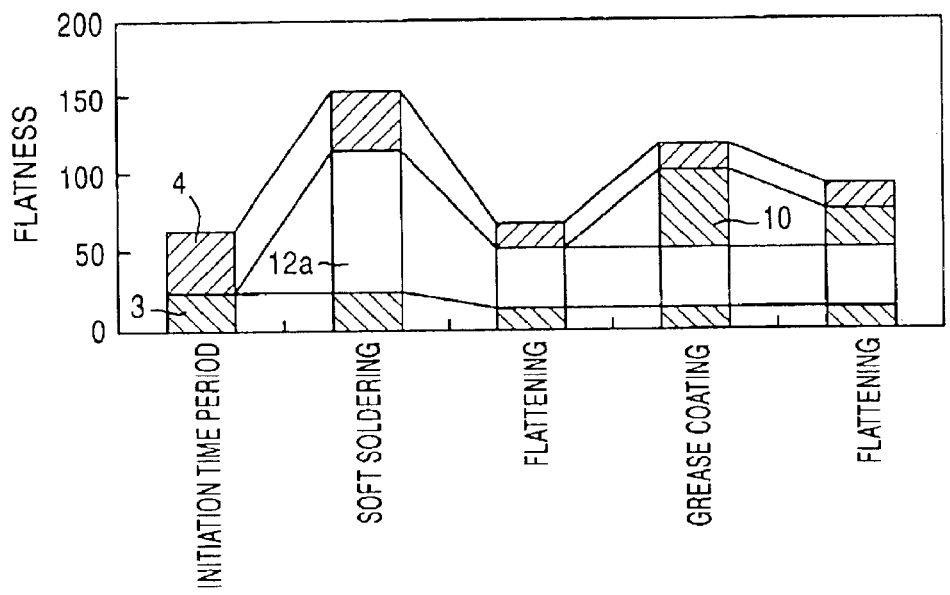
FIG. 11 is a graphical representation showing the flatness of a temperature control device.
Figure 11B:
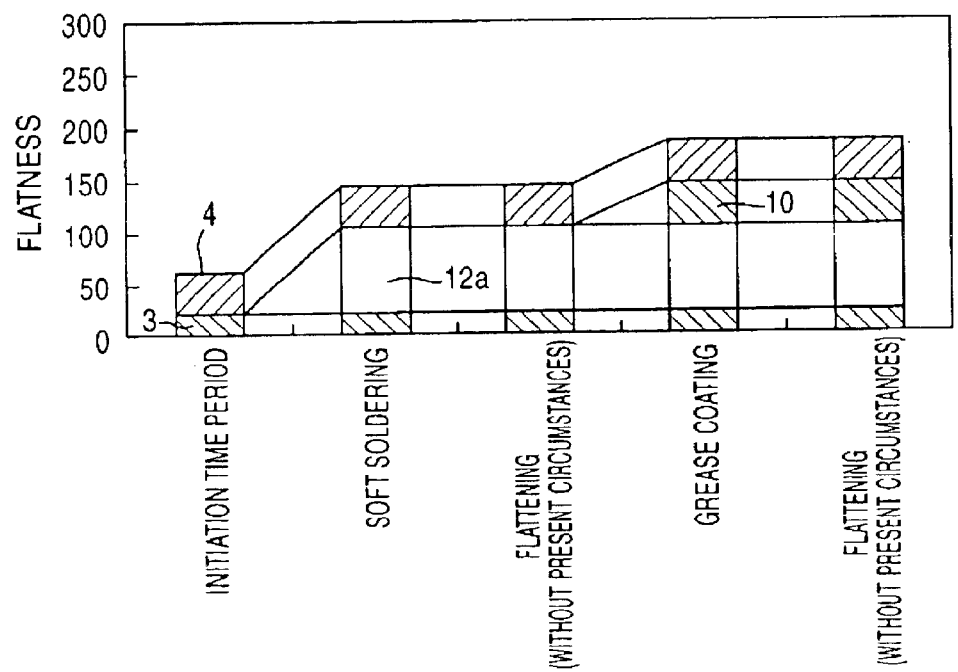

FIG. 11 is a graphical representation showing the flatness of a temperature control device. FIG. 11(a) shows the flatness of a temperature control device fabricated according to the method of fabrication of the present invention, FIG. 11(b) shows the flatness of a temperature control device fabricated according to a conventional method of fabrication The initiation state is referred to the flatness in the state where only the water cooling plate 4 and the homogenously heating plate 3 exist. In the present invention, as shown in FIG. 11(a), since the flattening is carried out after the soft soldering is performed, and the flattening is also carried out after the grease coating, the lowering of the flatness is suppressed to 1.5-fold of the initiation state. On the other hand, in a conventional technology, as shown in FIG. 11(b), since the flattening after the soft soldering is performed and the flattening after the grease is coated are not carried out, the flatness is lowered to the flatness on the order of 4-fold of the initiation state.

The fabrication method of the present invention has three features of: (1) the process of soft soldering, (2) the process of flattening of the soft solder layer, and (3) the process of flattening of the grease layer. Then, although the flatness can be enhanced if only any one process out of the three processes is carried out, if any two processes are carried out, the flatness can be more enhanced, and if all of the three processes are carried out, the flatness can be enhanced at maximum thereof. Then, it will be available to carryout the three processes independently, since the respective processes are subjected to the heating and pressurizing processes, if the processes are carried out sequentially or in the same period, the fabrication time can be diminished. Moreover, the heating and pressurized device can be shared, the reduction of the fabrication cost can be realized. Hence, the temperature/load conditions in the case where the multiple processes are carried out sequentially or in the same time period will be described below.

Figure 12:
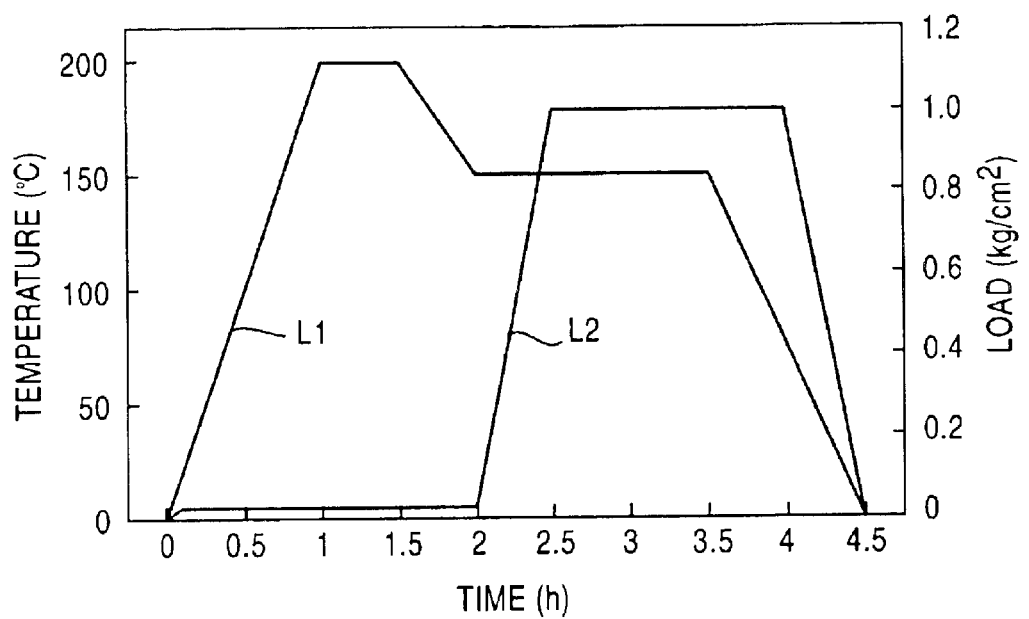
FIG. 12 is a time chart showing a temperature/load conditions when the process of a soft soldering and flattening process of a soft solder layer are sequentially carried out.

FIG. 12 is a time chart in the case where the process of the soft soldering and the process of the flattening of the soft solder layer is sequentially carried out. The solid line L1 denotes the changing of the temperature, and the solid line L2 denotes the changing of the load. The time period of 0–2 hours is the process of the soft soldering, the time period of 2–4.5 hours is the process of flattening of the soft solder layer. In the process of soft soldering, it is heated to about 200° C. more than the temperature of the fusing point of the soft solder in a state of a slight load being added. Moreover, in the process of flattening, it is heated to about 160° C. which is less than the fusing point of the soft solder and more than the apparent initial softening point in a state of adding a load of about 1 kg/cm². Subsequently, after coating the grease and disposing the water cooling plate 4, the flattening process of the grease layer is carried out.

Figure 13:
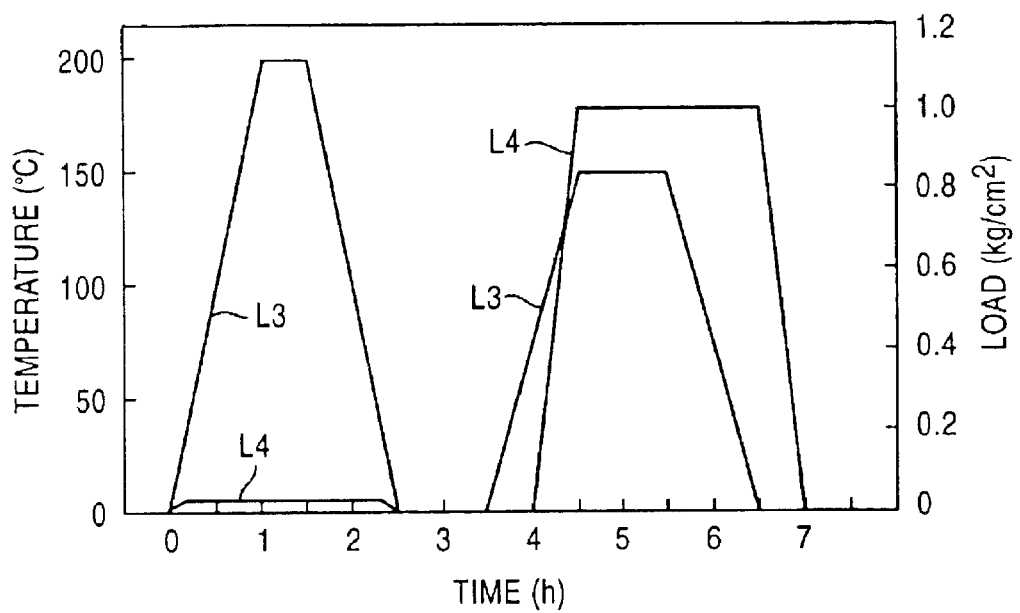
FIG. 13 is a time chart showing a temperature/load conditions when the flattening process of a soft soldering and the flattening process of a grease layer are sequentially carried out.

FIG. 13 is a time chart in the case where the flattening process of the soft solder and the flattening process of the grease layer are carried out in the same time period. The solid line L3 denotes the changing of the temperature, and the solid line L4 denotes the changing of the load. The time period of 0–2.5 hours is the process of soft soldering, the time period of 2.5–3.5 hours is the process of grease coating and water cooling plate disposition, and the time period of 3.5–6 hours is the process of flattening of the soft solder and the grease layer. In the process of soft soldering, it is heated to the temperature of about 200° C. more than the fusing point of the soft solder in a state of adding a slight load. After completing the process of soft soldering, the grease is coated on the surface of the insulating substrate 6 and the water cooling plate 4 is disposed. Then, in the flattening process of the soft solder layer and the grease layer, it is heated to the temperature of about 160° C. which is less than the fusing point and more than the apparent initial softening point of the soft solder in a state of adding the load of about 1 kg/cm². In this manner, since the grease is coated and the water cooling plate 4 is disposed after the soft soldering is performed, the deviation of location between the thermionic element 9 and the soft solder 12 is not generated, the soft soldering can be carried out quite well.

Figure 14:
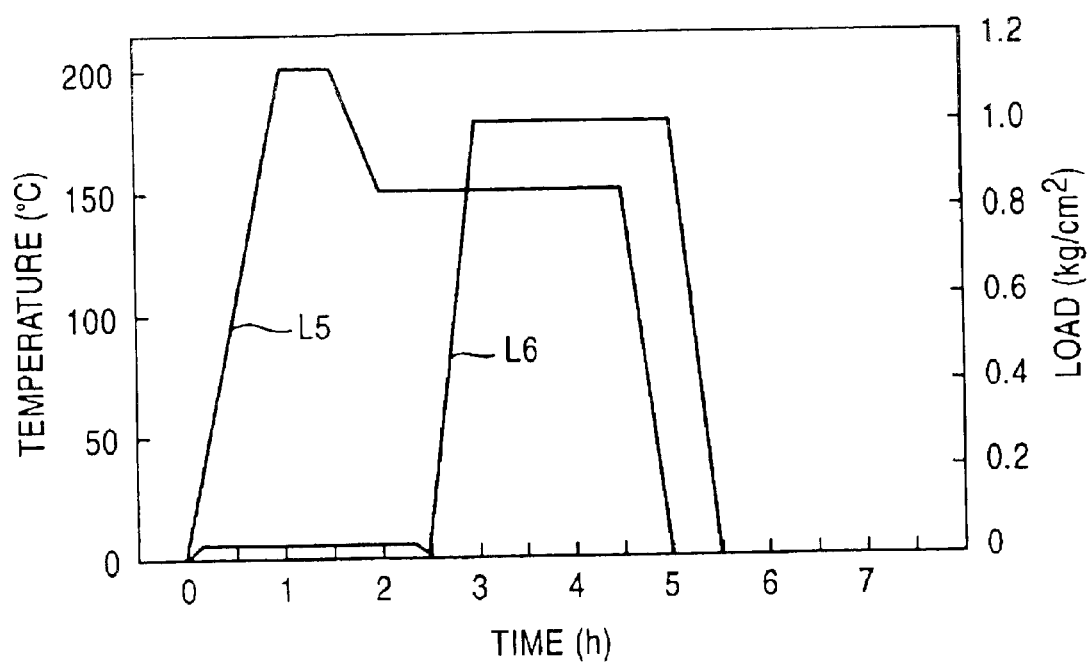
FIG. 14 is a time chart showing a temperature/load conditions when the flattening process of a soft solder layer and the flattening process of a grease layer is carried out at the same time period as well as the process of the soft soldering and the flattening process of a soft solder layer are sequentially carried out.

FIG. 14 is a time chart in the case where the flattening process of the soft solder and the flattening process of the grease layer are carried out in the same time period as well as the soft soldering process and the flattening process are sequentially carried out. The solid line L5 denotes the changing of the temperature, and the solid line L6 denotes the changing of the load. The time period of 0–2 hours is the process of the soft soldering, and the time period of 2–5.5 hours is the flattening process of the soft solder layer and the grease layer. First, prior to the process of the soft soldering, the grease is coated on the surface of the insulating substrate 6 and the water cooling plate 4 is disposed. Then, it is heated to the temperature of about 200° C. more than the fusing point of the soft solder in a state of adding a slight load. Subsequently, in the flattening process of the soft solder layer and the grease layer, it is heated to the temperature of about 160° C. which is less than the fusing point of the soft solder and more than the apparent initial softening point in a state of adding the about 1 kg/cm$^2$. Accordingly, since prior to the soft soldering, the grease is coated and the water cooling plate 4 is disposed, the three processes can be carried out sequentially and in the same time period, and the fabrication time can be diminished.

Figure 15A:
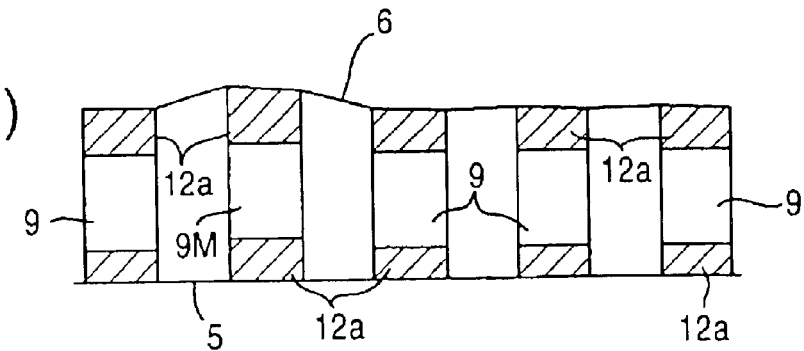
FIG. 15 is a sectional view for illustrating a flattening mechanism of a soft solder layer/a grease layer.
Figure 15B:
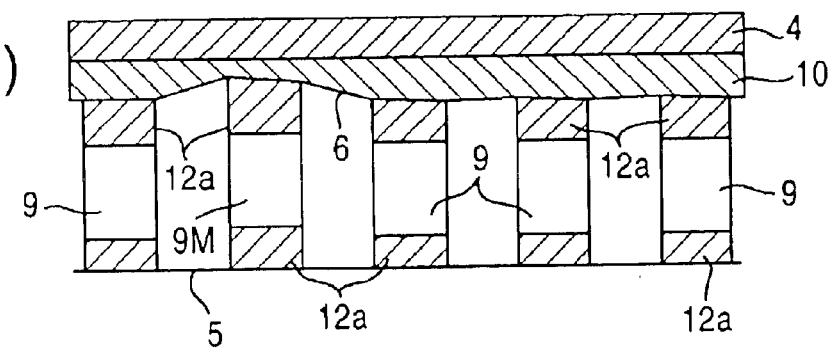

FIG. 15 is a sectional view for illustrating the flattening mechanism of the soft solder layer and the grease layer. Moreover, FIG. 16 is a graphical representation for illustrating the flattening mechanism of the grease layer, wherein FIG. 16(a) is a graph showing the relationship between the thickness of the grease layer and the pressurized force at the individual temperatures, FIG. 16(b) is a graph showing the relationship between the thickness of the grease layer and the pressurized force at the temperature of 150° C., and FIG. 16(c) is a graph showing the changing of the load accompanying with the time passing.

Figure 15C:
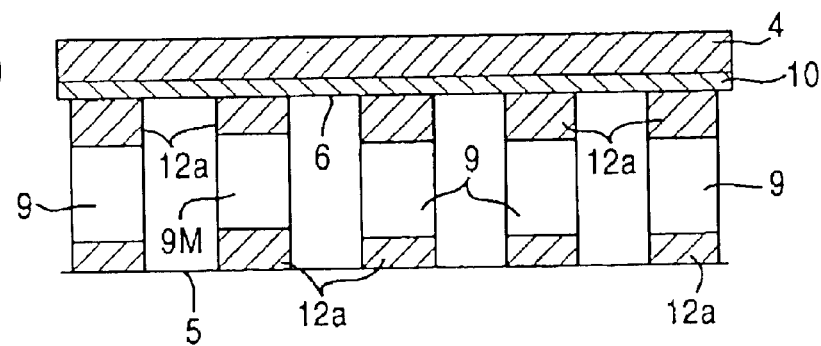
Figure 16A:
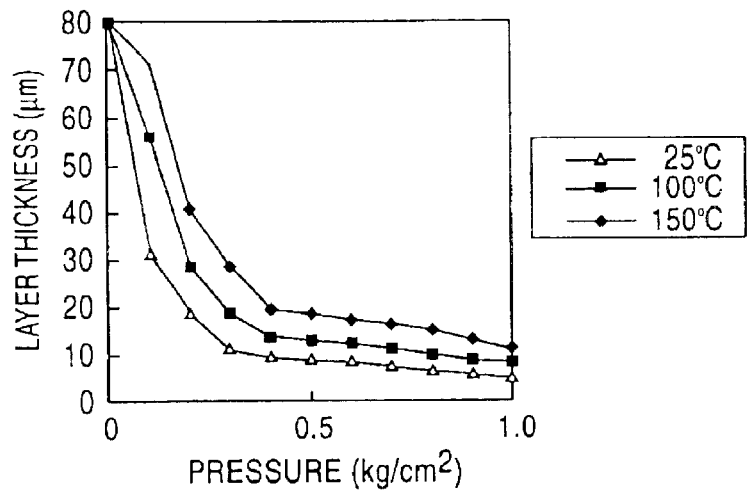
FIG. 16 is a graphical representation for illustrating a flattening mechanism of a grease layer.
Figure 16B:
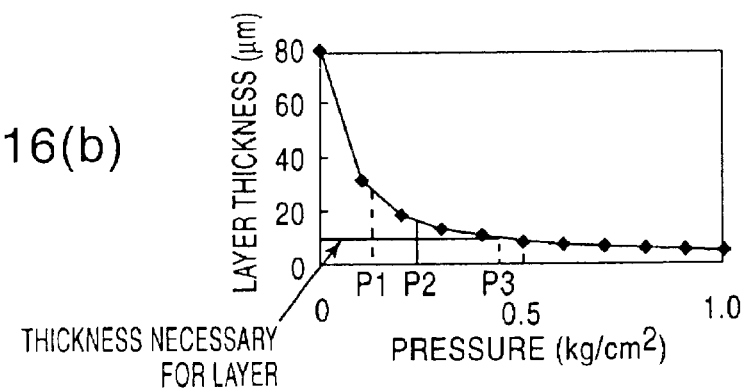
Figure 16C:
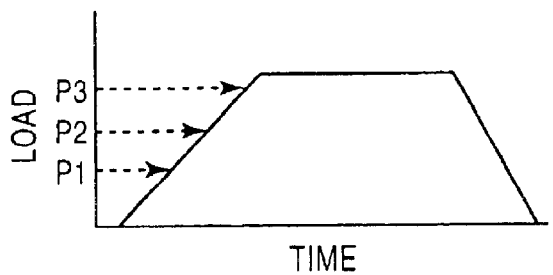

Taking an area of the water cooling plate 4 as S and area ratio of the thermionic element 9 as A (%), and supposing that M pieces of the thermionic element 9 out of N pieces of the thermionic element 9 is projected in the length of 20 μm, the reference letter M is attached to projected thermionic element 9 in FIG. 15 for the purpose of the distinguishable representation. Since the relationship between the grease layer thickness and the pressurized force is represented in FIG. 16(b), when the pressurization is initiated as shown in FIG. 16(c), as defining that Y is yield strength of the soft solder, at the time when the load P1 satisfying the relationship of the equation of "the pressurized force (P1×S)=Y× (N/M)×A×S, the deformation of the projected portion of the soft solder layer 12a is initiated, and the height of the projected portion becomes the same height with the surroundings. As a result, supposing that the flatness of the soft solder layer 12a is 0, the load adding to one piece of the thermionic element satisfies the equation of P2=Y×M/N, which is less than the value of yield strength, and the soft solder layer 12a is deformed no more. Furthermore, as the load is increased, the thickness of the grease layer 10 becomes thinner as shown in FIG. 15(c), the load is increased until the load P3 which is corresponding to the necessary layer thickness is achieved, and then the load P3 is maintained.

As described above, as the load is added as shown in FIG. 16(c), the deformation of the soft solder layer 12a is initiated at the time when the load achieves the value of P1, the flattening is achieved by the time the load achieves to the value of P2, and the soft solder layer 12a is not deformed. Furthermore, the thickness of the layer of the grease layer 10 is decreased by increasing the load, and the necessary thickness of layer is achieved at the time when the load is P3. As a results, the flattening of the soft solder layer 12a and control of the thickness of the grease layer (thinning of the film) are achieved.

Figure 17A:
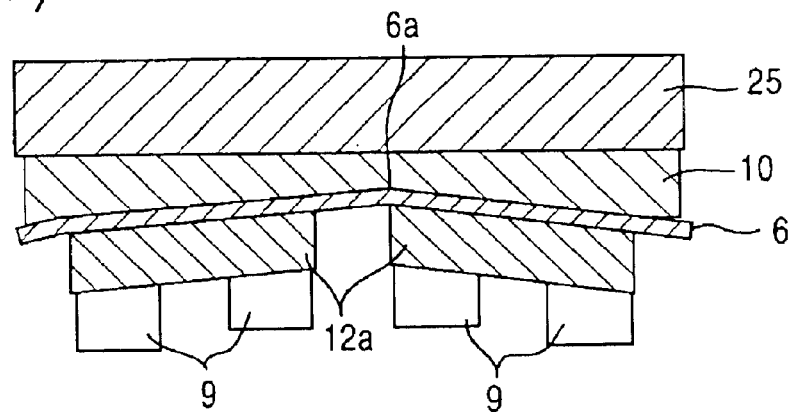
FIG. 17 is a sectional view showing a pressurized state against an insulating substrate.
Figure 17B:
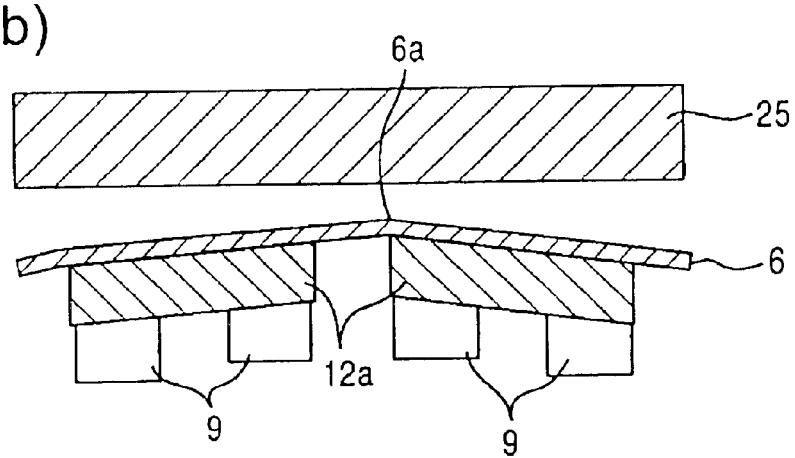
Figure 18:
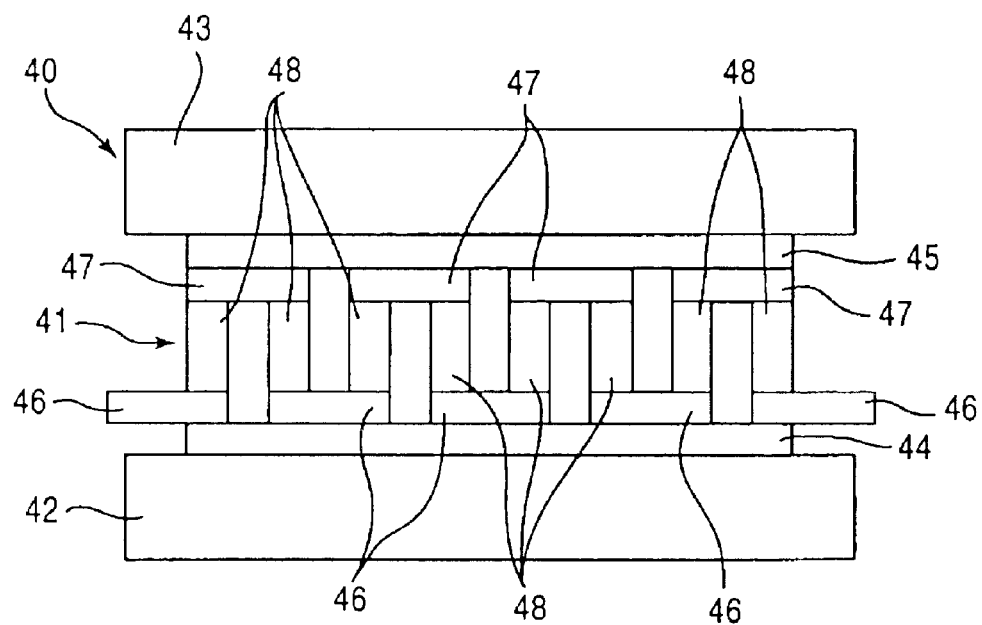
FIG. 18 is a side elevation view showing a schematic configuration of a temperature control device.

FIG. 17 is a sectional view showing the pressurized state against the insulating substrate 6. As shown in FIG. 17(b), in the case where a pressurizing plate 25 is pushed on the insulating substrate 6 and pressurized in order to carry out the flattening after the soft soldering process, the projection portion 6a of the insulating substrate 6 is locally contacted with the pressurizing plate 25, the locally face pressure of the projection portion 6a becomes large, and the possibility of destruction of the thermionic element 9 becomes higher. On the other hand, as shown in FIG. 17(a), since the pressure is dispersed if the grease layer 10 is stood between, the destruction of the thermionic element 9 is prevented. It should be noted that the pressurizing plate 25 is corresponding to the above described weight 20 or the water cooling plate 4. Therefore, the destruction of the thermionic element 9 can be prevented and the yield can be enhanced by carrying out the flattening process of the soft solder layer 12a and the flattening process of the grease layer 10 in the same time period.

It should be noted that in the present embodiment, although the temperature control device 1 whose structure of disposing only the water cooling plate 4 by making the grease layer 10 stand therebetween is exemplified and described, the present invention can be also applied to the temperature control device having a structure of disposing both of the homogenously heating plate 3 and the water cooling plate 4 by making the grease layer stand therebetween.

What is claimed is:

1. A method of fabricating a temperature control device equipped with a temperature control element configured by soft-soldering a thermionic element between a pair of opposed electrodes and a pair of heat conduction plates disposed respectively on outside surfaces of respective insulating substrates of the temperature control element of a temperature control device, said pairs of electrodes are formed respectively on opposing surfaces of a pair of insulating substrates disposed in opposed positions, at least one plate of said pair of heat conduction plates is disposed on an outside surface of one of the insulating substrates after soft soldering is performed with said thermonic element, said one of the insulating substrates on which said at least one plate is disposed after soft soldering is flexible, and in said soft soldering of thermionic element, a soft solder in which a layer thickness control member is mixed while adding a predetermined pressure.

2. A method of fabricating a temperature control device equipped with a temperature control element configured by soft-soldering a thermionic element between a pair of opposed electrodes and a pair of heat conduction plates disposed respectively on outside surfaces of respective insulating substrates of a temperature control element, the pair of electrodes are formed respectively on opposing surfaces of a pair of insulating substrates disposed in opposed positions, at least one plate of said pair of heat conduction plates is disposed on an outside surface of one of the insulating substrates after soft soldering is performed, said one of the insulating substrates on which said at least one plate is disposed after soft soldering is flexible and after soft soldering of said thermionic element is performed, a soft solder layer is flattened by adding a pressure multiplied by 0.8–1.5 of yield stress at a temperature; and said soft solder layer is heated to a first temperature which is the fusing point of a soft solder or to a temperature less than said first temperature and a second temperature which is the apparent initial softening point of a soft solder or to a temperature more than said second temperature.

3. The method of fabricating a temperature control device according to claim 2, wherein said soft solder layer contains a layer thickness control member.

4. A method of fabricating a temperature control device equipped with a temperature control element configured by soft-soldering a thermionic element between a pair of opposed electrodes and a pair of heat conduction plates disposed respectively on outside surfaces of respective insulating substrates of a temperature control element, the pair of electrodes are formed respectively on opposing surfaces of a pair of insulating substrates disposed in opposed positions, at least one plate of said pair of heat conduction plates is disposed on an outside surface of one of said pairs of insulating substrates by making a grease layer provided therebetween, the one of said pair of substrates on which said at least one plate is disposed, by providing the grease layer therebetween, is flexible, after said at least one plate is disposed by providing the grease layer between the relevant plate and one of said pair of insulating substrate, said grease layer is flattened by adding a pressure in a range from 0.6–10 kg/cm$^2$ as well as heating in a range from 120–170° C.

5. The method of fabricating a temperature control device according to claim 4, wherein after soft soldering of said thermionic element is performed, a soft solder layer is flattened by heating said soft solder layer to a first temperature which is the fusing point of a soft solder or to a temperature less than said first temperature and a second temperature which is the apparent initial softening point of a soft solder or to a temperature more than said second temperature;

adding a pressure multiplied by 0.8–1.5 of yield stress at a relevant temperature, and flattening of said grease layer and the flattening of said soft solder layer are carried out in the same time period.

6. The method of fabricating a temperature control device according to claim 5, wherein prior to soft soldering of said thermionic element, a heat conduction plate is disposed by providing the grease layer between the relevant plate and an insulating substrate.

7. The method of fabricating a temperature control device according to claim 5, wherein after soft soldering of said thermionic element is performed, a heat conduction plate is disposed by providing the grease layer between the relevant plate and an insulating substrate.

* * * * *